(12) United States Patent
Ha et al.

(10) Patent No.: US 7,645,626 B2
(45) Date of Patent: Jan. 12, 2010

(54) MULTIPLE GAINNAS QUANTUM WELLS FOR HIGH POWER APPLICATIONS

(75) Inventors: Wonill Ha, Mountain View, CA (US); Vincent Gambin, Menlo Park, CA (US); James S. Harris, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 709 days.

(21) Appl. No.: 11/027,436

(22) Filed: Dec. 30, 2004

(65) Prior Publication Data

US 2006/0039432 A1 Feb. 23, 2006

Related U.S. Application Data

(63) Continuation of application No. 10/223,404, filed on Aug. 19, 2002, now abandoned, which is a continuation-in-part of application No. 09/738,534, filed on Dec. 15, 2000, now abandoned, and a continuation-in-part of application No. 09/738,907, filed on Dec. 15, 2000, now abandoned.

(51) Int. Cl.
    *H01L 21/00* (2006.01)
(52) U.S. Cl. .............................. 438/46; 438/22; 438/47; 257/E33.024; 257/E33.025
(58) Field of Classification Search .................. 438/22, 438/46–47; 257/E33.021, E33.023, E33.024, 257/E33.025
    See application file for complete search history.

(56) References Cited

U.S. PATENT DOCUMENTS

| 4,599,728 A | 7/1986 | Alavi et al. |
| 5,068,868 A | 11/1991 | Deppe et al. |
| 5,524,017 A | 6/1996 | Endo |
| 5,638,392 A | 6/1997 | Ramdani et al. |

(Continued)

FOREIGN PATENT DOCUMENTS

JP 10-145003 A 5/1998

(Continued)

OTHER PUBLICATIONS

Spruytte et al. "Nitrogen incorporation in group III-nitride-arsenide materials grown by elemenal source molecular beam epitaxy," Journal of Crystal Growth Jul. 2001 aviable online Jun. 2001.*

(Continued)

*Primary Examiner*—Davienne Monbleau
*Assistant Examiner*—Matthew Reames
(74) *Attorney, Agent, or Firm*—Crawford Maunu PLLC

(57) ABSTRACT

In connection with an optical-electronic semiconductor device, improved photoluminescent output is provided at wavelengths approaching and beyond 1.3 μm. According to one aspect, a multiple quantum well strain compensated structure is formed using a GaInNAs-based quantum well laser diode with GaNAs-based barrier layers. By growing tensile-strained GaNAs barrier layers, a larger active region with multiple quantum wells can be formed increasing the optical gain of the device. In example implementations, both edge emitting laser devices and vertical cavity surface emitting laser (VCSEL) devices can be grown with at least several quantum wells, for example, nine quantum wells, and with room temperature emission approaching and beyond 1.3 μm.

18 Claims, 4 Drawing Sheets

U.S. PATENT DOCUMENTS

| | | | |
|---|---|---|---|
| 5,689,123 | A | 11/1997 | Major et al. |
| 5,719,894 | A | 2/1998 | Jewell et al. |
| 5,757,830 | A | 5/1998 | Liau et al. |
| 5,904,549 | A | 5/1999 | Sato |
| 5,923,691 | A | 7/1999 | Sato |
| 5,936,929 | A | 8/1999 | Jiang et al. |
| 5,937,274 | A | 8/1999 | Kondow et al. |
| 6,081,470 | A | 6/2000 | Vaccaro et al. |
| 6,081,541 | A | 6/2000 | Adachi et al. |
| 6,207,973 | B1 | 3/2001 | Sato et al. |
| 6,233,264 | B1 | 5/2001 | Sato |
| 6,449,299 | B1 | 9/2002 | Sato |
| 6,563,851 | B1 * | 5/2003 | Jikutani et al. ........... 372/45.01 |

FOREIGN PATENT DOCUMENTS

| | | |
|---|---|---|
| JP | 10-233557 A | 9/1998 |
| JP | 11-074807 A | 3/1999 |
| JP | 2000277867 A | 10/2000 |
| WO | WO 01/52373 A2 | 7/2001 |

OTHER PUBLICATIONS

Spruytte et al. "Molecular Beam Epitaxial Growth of Group III-Nitride-Arsenides for Long Wavelength Optoelectronics," 27th International Symposium on Compound Semiconductors, Oct. 2000.*

K. Nakahara et al., 1.3—$\mu$m Continuous-Wave Lasing Operation in GaInNAs Quantum—Well Lasers, IEEE Photonics Technology Letters, vol. 10, No. 4, Apr. 1998, pp. 487-488.

Boucart, J., et al., "1-mW CW-RT Monolithic VCSEL at 1.55 $\mu$m", IEEE Photonics Technology Letters, vol. 11, No. 6, Jun. 1999.

S.G. Spruytte, C.W. Coldren, A.F. Marshall, M.C. Larson, and J.S. Harris, *Proceedings of AVS First International Conference on Microelectronics and Interfaces* (2000). No Copy Available.

* cited by examiner

| | |
|---|---|
| 205 | GaNAs |
| 210 | GaInNAs |
| 215 | GaNAs |
| 220 | GaInNAs |
| 225 | GaNAs |
| 230 | GaInNAs |
| 235 | GaNAs |
| 240 | GaInNAs |
| 245 | GaNAs |
| 250 | GaInNAs |
| 255 | GaNAs |
| 260 | GaInNAs |
| 265 | GaNAs |
| 270 | GaInNAs |
| 275 | GaNAs |
| 280 | GaInNAs |
| 285 | GaNAs |
| 290 | GaInNAs |
| 295 | GaNAs |

MULTIPLE GAINNAS QUANTUM WELLS FOR HIGH POWER APPLICATIONS

RELATED PATENT DOCUMENTS

This is a continuation of U.S. patent application Ser. No. 10/223,404, filed on Aug. 19, 2002 now abandoned and bearing the same title, and which is a continuation-in-part of U.S. patent applications Ser. No. 09/738,534, filed on Dec. 15, 2000 now abandoned and entitled "LASER DIODE DEVICE WITH NITROGEN INCORPORATING BARRIER," and Ser. No. 09/738,907, filed on Dec. 15, 2000 now abandoned and entitled "METHOD FOR MANUFACTURING LASER DIODE WITH NITROGEN INCORPORATING BARRIER." Each of these patent documents is fully incorporated herein by reference priority to which is claimed under 35 U.S.C. § 120 for common subject matter.

FEDERALLY-SPONSORED RESEARCH AND DEVELOPMENT

This invention was made with Government Support under contracts MDA 972-00-1-0024 awarded by the Defense Advanced Research Projects Agency and contract N00014-01-1-0010 awarded by the Department of the Navy ONR. The U.S. Government has certain rights in this invention.

BACKGROUND STATEMENTS

The inventive aspects disclosed herein were made with Government support under contract N00014-01-100010 awarded by the Office of Naval Research. The Government has certain rights in these inventive aspects.

FIELD OF THE INVENTION

The present invention relates generally to optical semiconductor devices and is particularly advantageous for high power semiconductor laser devices operable at wavelengths approaching and beyond 1.3 µm.

BACKGROUND OF THE INVENTION

Over the past few decades, the field of optics has been used to enhance high-speed data communications in wide-ranging technology areas including, among a variety of others, laser printers, data storage, and optical telecommunications. In connection with optical telecommunications, for example, this development has largely displaced the large conical horn-reflector tower-mounted radio antennas having underground optical cables for telecommunication trunks to carry information traffic in the form of optical signals. Currently, quartz glass optical fibers are used to carry high volumes of data generated as light pulses at one end by laser diodes and detected at the other end by optical detectors.

A multi-heterojunction laser diode grown on a GaAs substrate is one common semiconductor device used as an optical transmitter for telecommunications applications. However, the relatively short wavelength of conventional GaAs devices (e.g., 850 nm) limits performance due to the wavelength dependent dispersion and loss properties of optical fiber. Additionally, the short wavelength limits the permissible optical power because of eye safety considerations. Longer optical wavelengths can overcome many of these limitations and allow data transmission at higher rates over longer distances. Efforts to improve long wavelength devices have included altering the various interfaces and internal compositions of each layer to tune the devices for minimum cost of fabrication, optimal device performance, and reductions in terms of size, heat generation, and power consumption.

Ideal wavelengths desired for laser sources in telecommunications are those for which the optical fiber has the lowest dispersion, 1.3 µm, or minimum loss, 1.55 µm. Thus, there have been ongoing efforts to produce improved high power optical semiconductor devices that operate at these wavelengths. There is no binary semiconductor with a bandgap at these wavelengths. Therefore, the focus has been to develop GaAs-based ternary or quaternary structures to achieve materials with bandgaps suitable for long wavelength devices.

The longest wavelengths available for devices on GaAs substrates have been typically around 1 µm and realized using single or multiple-layer GaInAs quantum wells. Growing GaInAs quantum wells on GaAs with optical wavelengths beyond 1.1 µm is difficult because increasing indium content further leads to the formation of crystalline defects and mechanical tension, compression or shear in and around the active layer. This internal stress can be attributable to, among other factors, lattice mismatch between the active region and the substrate, and improper temperature control during manufacture of the laser diode device. Inadequate temperature control during manufacture can also result in a higher threshold current of laser oscillation and poor temperature characteristics.

The addition of more indium to the GaInAs quantum well material, in an attempt to achieve longer wavelengths, is a limited approach because both the strain energy and the quantum confinement energy increase with increasing indium content. The quantum confinement energy increases because increasing indium results in smaller effective masses and deeper quantum wells which both serve to push the first quantum confined level to higher energies. Much of the decrease in the bulk energy gap associated with increasing the indium content of the quantum well material is negated, and more indium is required to achieve a given wavelength than would be predicted by the bulk bandgap dependence on the indium mole fraction.

Use of ternary materials, such as GaInAs, produces compressively strained structures when grown on GaAs substrates. Addition of a fourth small atom can be used to decrease the size of the lattice and reduce the mechanical strain of the structure. The addition of nitrogen to the laser diode active region composed of GaInAs can result in the longer wavelengths devices achievable on GaAs substrates. The nitrogen causes the bulk bandgap to significantly decrease and the associated smaller lattice constant of GaN results in less compressive strain in GaInNAs compared to InGaAs without the nitrogen.

In a device that incorporates N in the active layer, several layers of GaInNAs are included at the device center in an active region. This active region is used as the main source for the generation of light pulses, and includes outer GaAs contact layers grown on a GaAs substrate. To the inside of the outer contact layers and immediately bordering either side of the active layer are upper and lower cladding regions that contain core light while protecting against surface contaminant scattering. In response to a voltage differential presented via the electrodes at the outer contact layers, holes and electrons are respectively injected into the active layer from the layers above and below. The accumulation of these holes and electrons within the active layer results in their recombination, thereby stimulating the emission of photons and, oscillation at a wavelength defined largely by the composition of the active layer. Lasers operating at wavelengths approaching and beyond 1.3 µm have been demonstrated with GaInNAs active regions grown on GaAs substrates. Further, GaInNAs vertical cavity surface emitting laser (VCSEL) devices have been implemented.

GaInNAs is a potential material system for long-wavelength communication lasers and high power Raman amplifiers. Although GaInNAs-based laser devices can provide emissions up to 1.3 μm it is challenging to achieve both longer wavelength emission approaching and beyond 1.3 μm and high power output.

SUMMARY OF THE INVENTION

The present invention is directed to an approach for improving the power output of an optical-electronic semiconductor device operating at wavelengths approaching and longer than 1.3 μm using multiple quantum well layers with strain compensation for the quantum wells provided by barrier layers. Various example embodiments of the present invention are directed to and are advantageously used in many applications, such as medical devices, long wavelength communication lasers and high power Raman amplifiers.

In accordance with one embodiment of the present invention, an optical-electronic semiconductor device includes a GaAs-based substrate and an active region over the GaAs-based substrate. The active region includes multiple GaInNAs-based quantum well layers between GaNAs-based barrier layers. The GaNAs barrier layers provide strain compensation for the GaInNAs quantum well layers.

In another embodiment of the invention, an optical-electronic semiconductor device includes a GaAs-based substrate and an active region over the GaAs-based substrate. The active region includes multiple GaInNAs-based quantum well layers between GaNAs-based barrier layers. The GaNAs-based barrier layers provide strain compensation for the GaInNAs-based quantum well layers. The active region includes crystal defects and is annealed to remove non-radiative recombination centers otherwise present with Ga—N bonds in the active region. Portions of the optical-electronic semiconductor device are electrically coupled to the active region and are adapted for exciting the active region.

In yet another embodiment of the invention, a vertical cavity surface emitting optical-electronic semiconductor device includes a GaAs-based substrate, a first DBR region over the GaAs-based substrate and an active region over the first DBR region. The active region includes multiple GaInNAs quantum well layers adjacent a GaNAs barrier layers, the GaNAs barrier layers providing strain compensation for the GaInNAs quantum well layers. The active region includes crystal defects and is annealed to remove non-radiative recombination centers otherwise present in the active region. The device further includes a second DBR region over the annealed active region. The first and second DBR regions are oppositely-doped. Oppositely-doped electrodes are electrically coupled to the correspondingly respective first and second DBR regions and are adapted for exciting the active region and causing emissions through the GaAs-based substrate.

In another embodiment of the invention, an edge-emitting optical-electronic semiconductor device includes a GaAs-based substrate and an active region over the GaAs-based substrate. The active region includes multiple GaInNAs-based quantum well layers, each being surrounded by a pair of adjacent GaNAs-based barrier layers, the GaNAs barrier layers providing strain compensation for the GaInNAs quantum layers. The device further includes a first and a second cladding portion electrically coupled to the quantum well active region and adapted for exciting the active region.

Another embodiment of the invention provides a method for manufacturing an optical-electronic semiconductor device. The method includes providing a GaAs-based substrate and forming an active region over the GaAs-based substrate. The active region includes multiple GaInNAs-based quantum well layers between GaNAs-based barrier layers, the GaNAs barrier layers provide strain compensation for the GaInNAs barrier layers. The method further includes forming portions electrically coupled to the active region and adapted for exciting the active region.

In another embodiment of the invention, a method for manufacturing an optical-electronic semiconductor device includes providing a GaAs-based substrate and forming an active region over the GaAs-based substrate. The active region includes multiple GaInNAs-based quantum well layers between GaNAs-based barrier layers, the GaNAs barrier layers providing strain compensation for the GaInNAs quantum well layers. The method further includes growing a layer over the active region while annealing the active region and providing portions of the optical-electronic semiconductor device electrically coupled to the active region and adapted for exciting the active region.

Another embodiment of the invention is directed to a method for manufacturing a VSCEL optical-electronic device including providing a GaAs-based substrate and forming a multiple quantum well active region over the GaAs-based substrate. The active region includes multiple GaInNAs-based quantum well layers, each being surrounded by a pair of GaNAs-based barrier layers. The GaNAs barrier layers provide strain compensation for the GaInNAs quantum well layers. The method also includes forming mirror portions on either side of the multiple quantum well active region adapted for exciting the active region.

In yet another embodiment of the invention, a method for manufacturing an edge-emitter optical-electronic semiconductor device includes providing a GaAs-based substrate and forming a multiple quantum well active region over the GaAs-based substrate. The active region includes multiple GaInNAs-based quantum well layers, each quantum well layer being surrounded by a pair of adjacent GaNAs-based barrier layers. The GaNAs barrier layers provide strain compensation for the GaInNAs quantum well layers. The method includes forming cladding portions electrically coupled to the quantum well active region and adapted for exciting the active region.

A further embodiment of the invention provides a method for generating optical emission from an optical-electronic device. A GaAs-based substrate is provided and an active region is formed over the GaAs substrate. The active region includes multiple GaInNAs quantum wells between GaNAs barrier layers. The GaNAs barrier layers provide strain compensation for the GaInNAs quantum wells. Portions electrically coupled to the active region are formed, the portions being adapted for exciting the active region. The active region is excited to produce optical emission at wavelengths above 1.2 μm with power output of at least about 400 mW.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

BRIEF DESCRIPTION OF THE DRAWINGS

Various aspects and advantages of the present invention will become apparent upon reading the following detailed description of various embodiments and upon reference to the drawings in which:

FIG. 2 is a sectional view of an active region of a laser diode structure according to an example application of the present invention;

Figure 1:
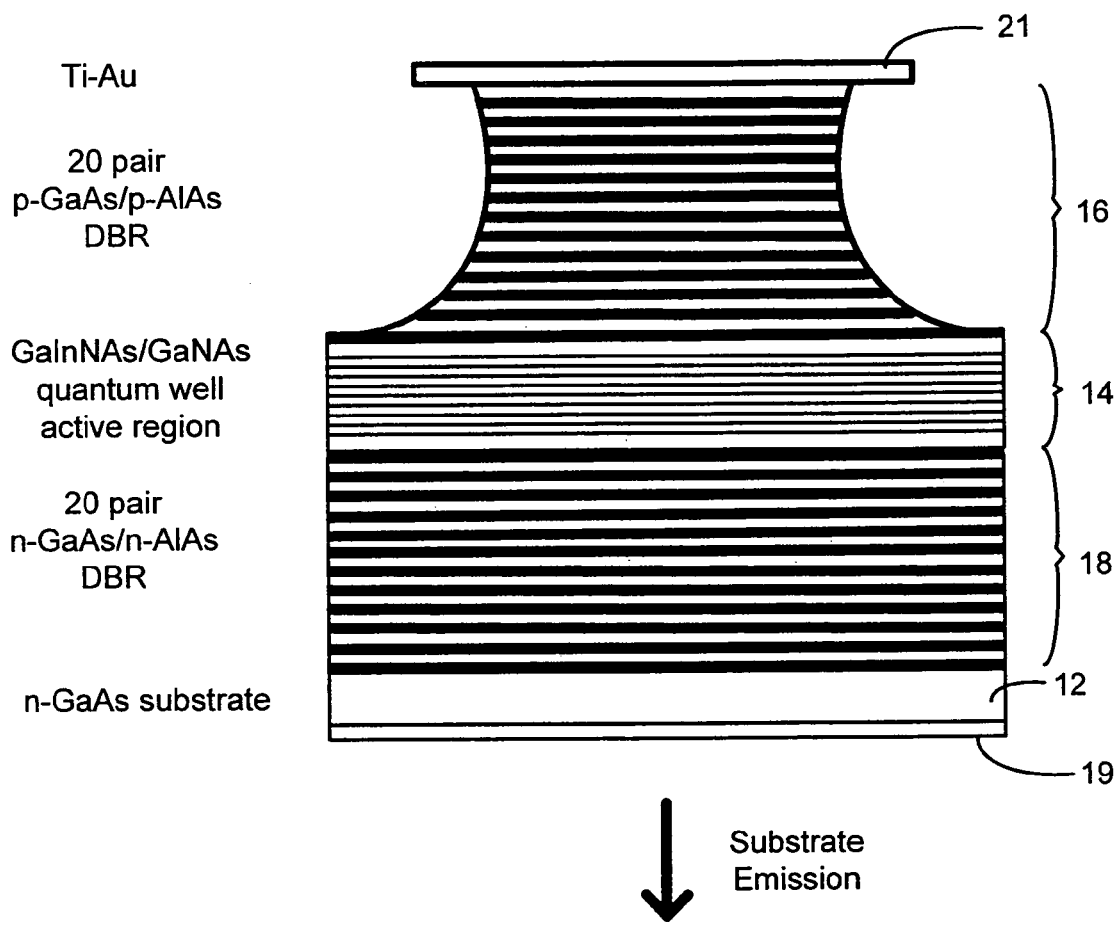
FIG. 1 is a sectional view of a laser diode structure according to an example application of the present invention.

While the invention is amenable to various modifications and alternative forms, specifics thereof have been shown by way of example in the drawings and will be described in detail below. It is to be understood, however, that the intention is not to limit the invention to the particular embodiments described. On the contrary, the invention is intended to cover all modifications, equivalents, and alternatives falling within the scope of the invention as defined by the appended claims.

DETAILED DESCRIPTION OF THE VARIOUS EMBODIMENTS

The present invention is directed to a method and an optical device for achieving higher optical power output with emission at longer wavelengths. According to one aspect of the present invention, it has been discovered that tensile-strained GaNAs-based barrier layers may be used to compensate for compressively strained GaInNAs-based quantum well layers. A strained layer lattice can be grown by alternating layers that are under appropriate compression and tension. By offsetting the compressive strain generated by multiple quantum wells with tensile-strained barrier layers, a greater number of quantum wells may be formed. In this regard, an active region with multiple quantum wells increases the total thickness of the active area beyond the inherent critical thickness of the GaInNAs material.

The present invention is believed to be applicable to a wide variety of circuit arrangements including optical semiconductor devices and, more specifically, to such circuit arrangements operable in wavelength bands approaching and above 1.3 μm. The present invention incorporates multiple compressive strained quantum wells surrounded by tensile strained barrier layers. Various example implementations of the present invention are described below through the following discussion of example applications. Those skilled in the art will appreciate that these implementations are merely examples and are not intended to limit the scope of the present invention.

An example embodiment of the present invention is directed to the manufacture of multiple quantum well optical-electronic semiconductor devices using a GaAs-based substrate. An active region having multiple GaInNAs-based quantum well layers is formed over the GaAs-based substrate. For such an implementation it has been discovered that forming GaNAs-based barrier layers over the GaInNAs-based quantum well layers improves operation of the optical-electronic semiconductor device by permitting its operation at a wavelength that is longer relative to an optical-electronic semiconductor device having, for example, simply a GaAs-based barrier layer without the nitrogen species. Furthermore, the tensile strained GaNAs barrier layers offset the compressive strained quantum well layers allowing multiple quantum wells to be formed. According to the present invention, this improved operation results from lower QW confinement energy for electrons, more limited nitrogen out diffusion from an N-based barrier layer to maintain longer wavelength emission, and improved ability to grow strain-compensated structures.

By a method of the invention, a multiple quantum well device with a highly strained active region of 30% indium, 1.7% nitrogen $Ga_{0.7}In_{0.3}N_{0.017}As_{0.983}$ and $GaN_{0.02}As_{0.98}$ barriers may be formed dislocation free. The total thickness of the active region for such a device is much greater than the critical thickness of GaInAs. By growing tensile strained GaNAs, a much larger active area can be formed greatly increasing the optical gain of the device. A power output exceeding about 400 mW can be achieved by the multiple quantum well device at wavelengths above 1.2 μm.

Furthermore, surrounding the quantum wells with GaNAs barrier layers yields longer wavelength devices. The GaNAs barriers have a larger concentration of nitrogen than the quantum wells, and this high nitrogen concentration works as a reservoir for quantum wells during an annealing process, reducing the nitrogen out-diffusion. Also, the band offsets between the barrier layers and the quantum well layers are reduced, thereby lowering the confinement energy within the active region and further red-shifting the wavelength emission. Overall confinement of carriers is not reduced since GaAs is grown away from the quantum wells inhibiting carrier diffusion at the GaNAs-GaAs interface.

According to another example embodiment of the present invention, it has been discovered that the above structure is enhanced through the growth of a mirror or cladding layer on top of the active region to anneal the active region. The post growth annealing can be tuned to optimize device performance.

A specific example embodiment of the present invention is illustrated in FIG. 1 as a sectional view of a vertical-cavity surface emitting laser ("VCSEL") structure 10. The VCSEL structure 10 includes an n+ GaAs substrate 12 upon which various layers are grown to form a GaInNAs-based quantum well laser device. The structure 10 in this specific example embodiment includes a nine quantum well active region 14 sandwiched between oppositely-doped multilayer reflector structures 16 and 18. In certain environments, these structures are distributed Bragg reflectors, hereinafter referred to as "DBR" structures 16 and 18. The upper DBR structure 16 is a 20 pair p-GaAs/p-AlAs DBR, and can be formed along with the other illustrated layers using conventional processing tools and techniques, for example, as discussed in U.S. Pat. Nos. 5,689,123, 5,904,549 and U.S. Pat. No. 5,923,691. The lower DBR structure 18 is a 22.5 pair n-GaAs/n-AlAs DBR. To enhance lasing operation, GaInNAs/GaNAs nine quantum well active region 14 can be surrounded by a GaAs cladding to have the cavity length fit to an integral number of half wavelengths. Also, the active region 14 should be at a maximum in the optical field and for a wavelength long cavity this is in the center.

As shown by the arrow emanating from the n+ GaAs substrate 12, the structure 10 is adapted for substrate emission. For exciting the active region 14, an electrode 19 can be formed on the bottom side of the substrate 12 with a window for the substrate emission, and an electrode 21 can be formed on the surface of the DBR structure 16 substrate to form a laser/optical integrated light source. Although not required, the electrode 21 in this example is implemented using a Ti—Au composition for its conductivity attributes.

The nine quantum well active region 14, as illustrated in FIG. 2, is shown to include QW layers 210, 220, 230, 240, 250, 260, 270, 280, 290, respectively, between GaNAs-based barrier layers 205, 215, 225, 235, 245, 255, 265, 275, 285, 295. In one example application, this illustrated structure is formed with each of the respective thicknesses of the QW layers 210, 220, 230, 240, 250, 260, 270, 280, 290 being 65 Angstroms, and each of the respective thicknesses of the GaNAs-based barrier layers 205, 215, 225, 235, 245, 255, 265, 275, 285, 295 being 200 Angstroms. An example set of compositions of each of the QW layers and the GaNAs-based barrier layers are $Ga_{0.07}In_{0.3}N_{0.017}As_{0.987}$ and $GaN_{0.02}As_{0.98}$, respectively.

Figure 3:
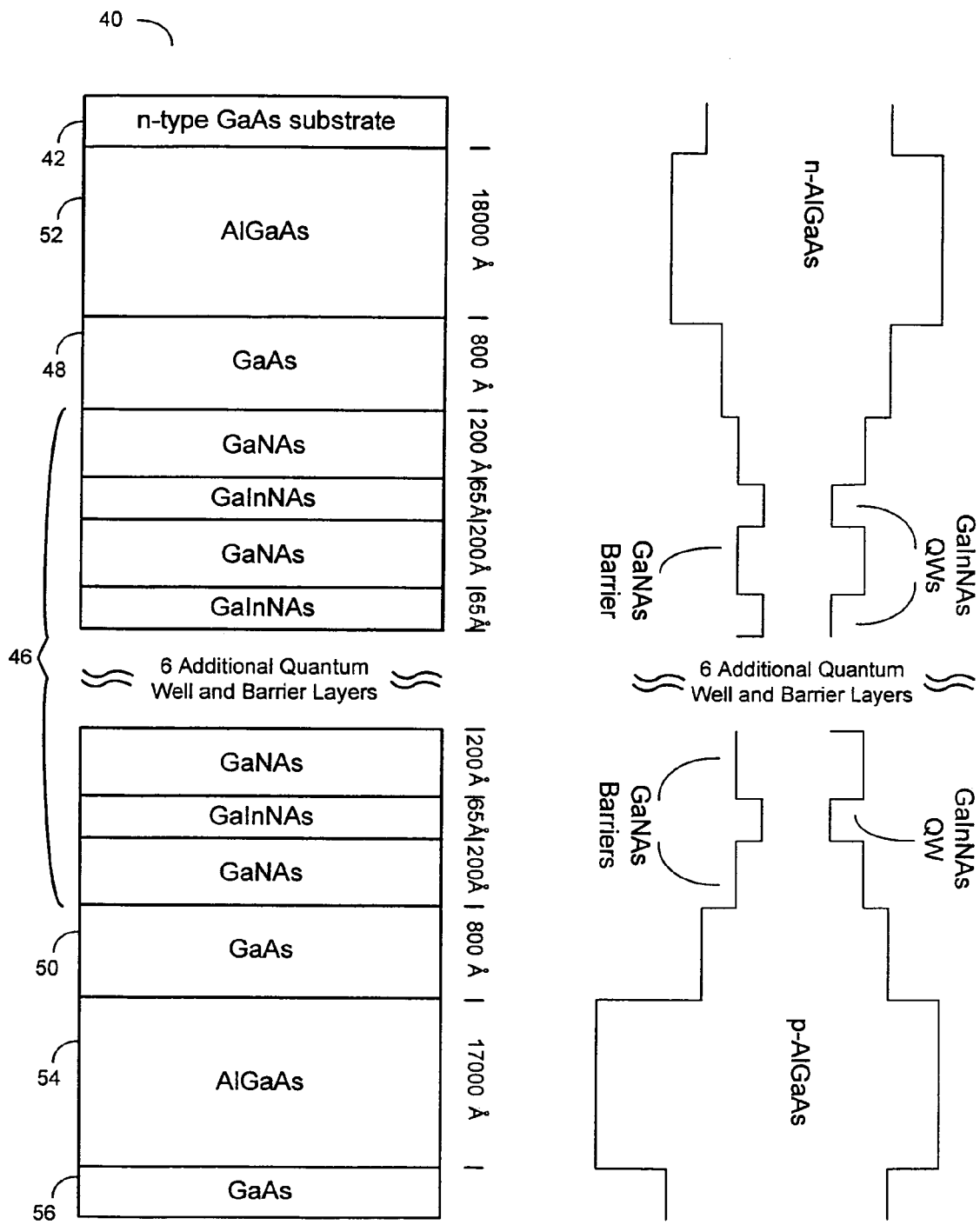
FIG. 3 is a sectional view of an alternate laser diode structure, according to an example application of the present invention.

Other specific example embodiments of the present invention are illustrated by way of FIG. 3 which shows a sectional view of an edge-emitting laser structure 40. Like the above-illustrated VCSEL structure 10, the edge-emitting laser structure 40 includes an n-type GaAs substrate 42 upon which various layers are grown to form a GaNAs-based quantum well laser device. In this specific example embodiment, the structure 40 includes a nine quantum well active region 46 which is built using the same thicknesses and layer compositions as discussed above for the nine quantum well active region 14 of FIG. 1.

The illustrated cross section of FIG. 3 also depicts optional GaAs layers 48 and 50 on either side of the active region 46 and to the inside of cladding regions 52 and 54. These GaAs layers 48 and 50, which can also be similarly configured in an alternative embodiment on either side of the active region 14 of FIG. 1, serve to mitigate defects associated with the incorporation of Nitrogen in the barrier layers of the active region. In certain embodiments, the cladding regions 52 and 54 are oppositely-doped portions, and corresponding electrodes are electrically coupled to the respective oppositely-doped portions for exciting the active region. In other embodiments, rather than being oppositely-doped, the cladding regions 52 and 54 are implemented as a tunnel junction structure where the active region is excited using current injection. For further reference on such an approach, reference may be made to Boucart, J. IEEE Photonics Technology Letters, Vol. 11, No. 6, p. 629-31. It will also be appreciated that undoped cladding regions may also be used on either side of the active region in an alternative embodiment for the VCSEL structure 14 of FIG. 1; a related undoped cladding approach is used in conjunction with a VCSEL structure described in the above-referenced U.S. Pat. No. 5,923,691.

In a particular example implementation that is consistent with FIG. 3, each of the GaAs layers 48 and 50 is 800 Angstroms in thickness, the cladding region 52 is n-type (for example, about 18000 Angstroms in thickness and composed of $Al_{0.33}Ga_{0.67}As$ $2.10^{18}/cm^3$ Si), the cladding region 54 is p-type (for example, about 17000 Angstroms in thickness and composed of $Al_{0.33}Ga_{0.67}As$ $7.10^{17}/cm^3$ Be). Contact layer 56 can be implemented, for example, using a 800-Angstrom layer thickness and a composition of GaAs $1.10^{19}/cm^3$ Be. As with the VCSEL structure 10, the active region 46 can be excited using electrodes (not shown) on either side of the illustrated structure.

Figure 4:
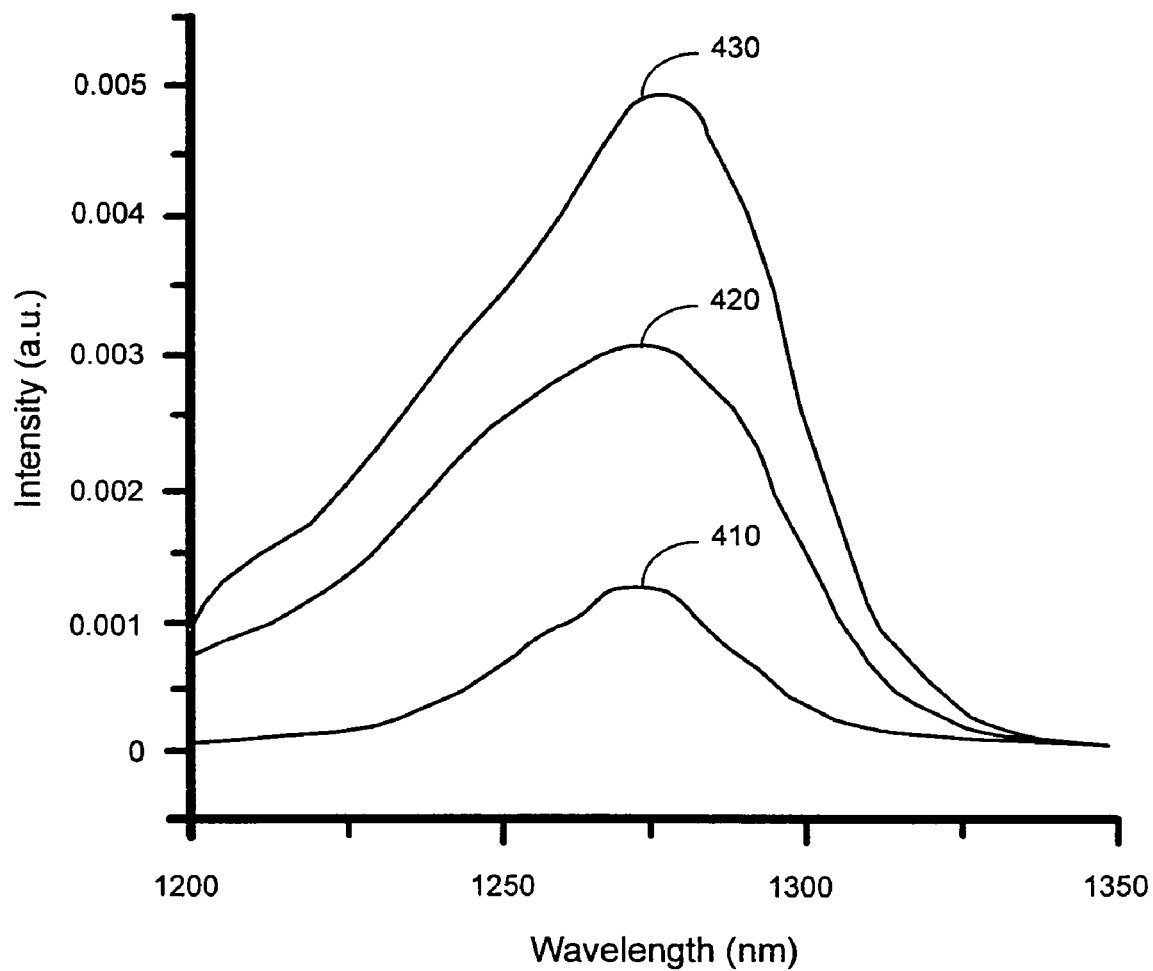
FIG. 4 is a graph showing three photoluminescence spectra for samples having three, six, and nine quantum wells according to the present invention.

FIG. 4 illustrates the increase in photoluminescent output of optical devices using the methods of the invention described above. Graph 410 illustrates the photoluminescent output of a device utilizing three quantum well layers. At 1275 nm, increasing the number of quantum layers from three to six increases the photoluminescence of the device 2.4 times, as shown in graph 420. A nine quantum well device has a photoluminescent output, illustrated in graph 430, almost four times that of the device with three quantum wells. A twelve quantum well device produces a photoluminescent output 5.5 times the output of the device having three quantum wells.

Each of the above-discussed approaches relates to the discovery herewith that multiple quantum well layers may be formed using strain compensation provided by GaNAs barrier layers. The use of tensile strained GaNAs barriers allows offsets in the compressive strain of GaInNAs quantum well layers, allowing the formation of multiple quantum well active regions. Strain compensated structures allow for larger active regions and higher optical power output. Additionally, small fractions of dopants or other atoms may be added to the quantum well structure to modify the characteristics of the device. Furthermore, the device characteristics may be enhanced by changing the size of the quantum wells, or the composition of the GaInNAs and/or GaNAs layers.

Further, the photoluminescence of a GaNAs quantum well or a GaInNAs quantum well increases drastically and shifts to shorter wavelengths during post growth annealing. The increase in photoluminescent efficiency results from a decrease in non-radiative recombination centers such as interstitials, point defects, anti-sites and vacancies. In this regard, non-radiative recombination centers are removed by annealing, e.g., for 1 minute at 780° C. under an $N_2$ ambient with a proximity cap. Further, it has been observed that the crystal quality of GaInNAs films increases with annealing, and that the GaInNAs quantum wells emitting at wavelengths approaching 1.3 µm and beyond are sharp and dislocation-free. By optimizing growth and anneal, low threshold edge emitting lasers and vertical cavity surface emitting lasers are realizable with GaInNAs active regions emitting at wavelengths approaching and in excess of 1.3 µm. For example, PL at 1.33 µm and broad area lasers emitting at 1.3 µm are realizable by using previously-known GaInNAs compositions but imbedding the quantum wells in GaNAs barriers instead of GaAs barriers. These longer wavelengths are due to decreased potential barriers for the well and decreased nitrogen out-diffusion during anneal and/or top cladding layer growth.

In one implementation, the growth of Nitride-Arsenides is performed in a Varian Gen II system, available from VEECO and Applied EPI, using elemental sources. Group III sources are provided by an effusion cell heated to a temperature sufficient to produce the desired flux. Arsenic is provided by a thermal cracker, in which the As flux moves through a cracking tube that converts the $As_4$ molecular species to $As_2$. Reactive nitrogen is provided by an RF plasma cell. The plasma conditions that maximize the amount of atomic nitrogen versus molecular nitrogen can be determined using the emission spectrum of the plasma.

The group III growth rate controls the GaNAs film's nitrogen concentration, where the nitrogen plasma is operated at 300 Watts with a nitrogen flow of about 0.25 to 0.5 sccm. The growth rate of the GaNAs film may be measured using various material analysis techniques, including High Resolution X-ray Diffractometry (HRXRD), secondary ion mass spectroscopy (SIMS) and electron microprobe analysis.

In this implementation, the nitrogen concentration is inversely proportional to the Group III growth rate because the available amount of radical nitrogen in the growth chamber is constant and the amount of $N_2$ formation is negligible at the low growth temperatures used. Thus, the GaInNAs system is advantageous in terms of yield and reproducibility compared to the arsenide-phosphide system where a group V flux control is dependent on temperature.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes include, but are not necessarily limited to variations of the example compositions and thicknesses, variations of some of the process steps used to achieve less than all of the advantages described, and various application-directed alterations for circuit integration implementations such as described and/or illustrated for example in connection with the illustrated embodiments of the other above-mentioned patents. Such modifications and changes do not depart from the true spirit and scope of the present invention that is set forth in the following claims.

What is claimed is:

1. A method for manufacturing an optical-electronic semiconductor device for operating at wavelengths of at least 1.2 µm, comprising:
   providing a GaAs-based substrate;
   forming an active region over the GaAs-based substrate, the active region being configured to exhibit a photoluminescent intensity in response to an excitation and including forming multiple GaInNAs-based quantum well layers and growing multiple tensile-strained GaNAs-based barrier layers, each of the GaNAs-based barrier layers having a concentration of N that is greater than a concentration of N in each of the GaInNAs-based quantum well layers;
   processing the active region without reducing overall confinement of carriers; and
   forming portions electrically coupled to the active region and adapted for exciting the active region.

2. The method of claim 1, wherein processing the active region includes annealing.

3. The method of claim 1, wherein processing the active region includes growing another layer over the active region.

4. The method of claim 1, wherein forming multiple GaInNAs-based quantum well layers includes forming at least three GaInNAs-based quantum well layers and the semiconductor device has a photoluminescent intensity.

5. The method of claim 4, wherein forming multiple GaInNAs-based quantum well layers includes forming at least three additional GaInNAs-based quantum well layers to configure the active region to exhibit a photoluminescent intensity of at least 2.4 times greater than the photoluminescent intensity of the semiconductor device having at least three GaInNAs-based quantum well layers.

6. The method of claim 4, wherein forming multiple GaInNAs-based quantum well layers includes forming at least six additional GaInNAs-based quantum well layers to configure the active region to exhibit a photoluminescent intensity of at least four times greater than the photoluminescent intensity of the semiconductor device having at least three GaInNAs-based quantum well layers.

7. The method of claim 1, wherein a quantum well layer having at least about 2% or greater concentration of N has at least a ten times greater concentration of In than the concentration of N.

8. The method of claim 1, wherein a quantum well layer having at least about 2% or greater concentration of N has at least a fifteen times greater concentration of In than the concentration of N.

9. The method of claim 1, wherein forming the active region includes using percentages of N and In in the quantum well layers adapted to mitigate an increase in quantum well confinement energy.

10. The method of claim 1, wherein processing the active region includes using Nitrogen carriers in the GaNAs-based barrier layers as a reservoir for quantum wells while annealing the active region.

11. The method of claim 1, wherein processing the active region includes using Nitrogen carriers in the GaNAs-based barrier layers as a reservoir for quantum wells while annealing the active region at a temperature of at least about 750° C. to remove radiative recombination centers in the active region and increase the crystal quality of the GaInNAs-based quantum well layers.

12. A method for manufacturing an optical-electronic semiconductor device for operating at wavelengths of at least 1.2 µm, the method comprising:
   providing a GaAs-based substrate;
   forming an active region over the GaAs-based substrate by
      forming multiple GaInNAs-based quantum well layers and multiple tensile-strained GaNAs-based barrier layers to configure the active region to exhibit a photoluminescent intensity in response to an excitation, each of the GaNAs-based barrier layers having a concentration of N that is greater than a concentration of N in each of the GaInNAs-based quantum well layers, and
      using the multiple tensile-strained GaNAs-based barrier layers to offset compressive strain of the quantum well layers;
   annealing the active region, using Nitrogen carriers in the GaNAs based barrier layers as a reservoir for quantum wells in the GaInNAs-based quantum well layers, to mitigate the reduction of an overall confinement of carriers; and
   forming an excitation circuit electrically that is coupled to the active region and configured to excite the active region.

13. The method of claim 12, wherein forming the GaNAs-based barrier layers includes forming the layers with a Nitrogen concentrate that is at least ten times greater than the Nitrogen concentration of the GaInNAs-based quantum well layers, the concentration being sufficient to mitigate the reduction of overall confinement of carriers by providing the reservoir for quantum wells.

14. The method of claim 12, wherein processing the active region to mitigate the reduction of an overall confinement of carriers includes annealing the quantum well layers at a temperature of at least about 750° C. to remove non-radiative recombination centers at Ga—N bonds in the active region.

15. The method of claim 12, further including doping at least one of the quantum well layers to modify photoluminescence characteristics of the active region.

16. The method of claim 12, wherein forming multiple GaInNAs-based quantum well layers includes selecting the size of at least one of the quantum well layers to set photoluminescence characteristics of the active region and forming the at least one of the quantum well layers with the selected size.

17. The method of claim 12, wherein forming multiple GaInNAs-based quantum well layers includes selecting the composition of at least one of the quantum well layers to set photoluminescence characteristics of the active region and forming the at least one of the quantum well layers with the selected composition.

18. The method of claim 12, wherein processing the active region to mitigate the reduction of an overall confinement of carriers includes annealing the quantum well layers to shift the wavelength of photoluminescence emission characteristics of the quantum well layers to a shorter wavelength.

* * * * *

UNITED STATES PATENT AND TRADEMARK OFFICE
CERTIFICATE OF CORRECTION

PATENT NO. : 7,645,626 B2  Page 1 of 1
APPLICATION NO. : 11/027436
DATED : January 12, 2010
INVENTOR(S) : Ha et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1201 days.

Signed and Sealed this

Twenty-eighth Day of December, 2010

David J. Kappos
*Director of the United States Patent and Trademark Office*